United States Patent
Sawada et al.

(10) Patent No.: US 8,728,585 B2
(45) Date of Patent: May 20, 2014

(54) METHOD FOR ENHANCING ADHESION OF THIN FILM

(75) Inventors: Hiroshi Sawada, Kusatsu (JP); Kosuke Kawahara, Kusatsu (JP)

(73) Assignee: Canon Machinery Inc., Shiga (JP)

( * ) Notice: Subject to any disclaimer, the term of this patent is extended or adjusted under 35 U.S.C. 154(b) by 1910 days.

(21) Appl. No.: 11/630,906

(22) PCT Filed: Sep. 6, 2004

(86) PCT No.: PCT/JP2004/013277
§ 371 (c)(1), (2), (4) Date: Nov. 16, 2007

(87) PCT Pub. No.: WO2006/027850
PCT Pub. Date: Mar. 16, 2006

(65) Prior Publication Data
US 2008/0124486 A1    May 29, 2008

(51) Int. Cl.
*B05D 5/06* (2006.01)
*H05B 6/46* (2006.01)
*H05B 6/02* (2006.01)
*B05D 3/12* (2006.01)
*C23F 4/02* (2006.01)
*C23C 16/02* (2006.01)

(52) U.S. Cl.
CPC .............. *C23F 4/02* (2013.01); *C23C 16/0263* (2013.01)
USPC ............ 427/554; 427/553; 427/290; 427/292

(58) Field of Classification Search
CPC ........... B23K 26/0078; B23K 26/0084; B23K 26/0643; B23K 26/0665; C23F 4/02; C23C 16/0254; C23C 16/0263
USPC ........ 216/39, 52, 53, 94; 219/121.66, 121.69; 427/289, 290, 292, 307, 309, 457, 532, 427/553, 554
See application file for complete search history.

(56) References Cited

U.S. PATENT DOCUMENTS 5,569,399 A * 10/1996 Penney et al. ............. 219/121.69
5,709,907 A *  1/1998 Battaglia et al. ........... 427/126.1
(Continued)

FOREIGN PATENT DOCUMENTS

JP      05057464 A   *  3/1993
JP     11-310868         11/1999
(Continued)

OTHER PUBLICATIONS

Akio Motoi, Seiji Kataoka and Kazuo Morikawa, "An Evaluation Method for the Adhesion of DLC Coated Tools Intended for Plastic Forming", Bulletin of Tokyo Metropolitan Industrial Technology Research Institute, 6, 2003.

(Continued)

*Primary Examiner* — Michael Wieczorek
(74) *Attorney, Agent, or Firm* — Wenderoth, Lind & Ponack, L.L.P.

(57) ABSTRACT

To provide a method for enhancing adhesion of a thin film, and a method for enhancing adhesion of a thin film provided with a surface function caused by the shape. Adhesion of a thin film can be enhanced by irradiating the surface of a parent material with a laser beam at a fluence in the vicinity of the machining threshold, scanning the irradiated part while overlapping to form a grating structure, and then forming a solid thin film in the grating structure. When the grating structure formed on the parent material is left on the solid thin film, adhesion of the thin film is enhanced and surface functions, e.g. reduction of friction and wear caused by the shape, suppression of adhesion of fine particles, and cell sensibility, can be exhibited in conjunction with the function of the solid thin film.

5 Claims, 13 Drawing Sheets

(56) References Cited

U.S. PATENT DOCUMENTS

| | | | | |
|---|---|---|---|---|
| 5,776,355 | A | * | 7/1998 | Martin .................... 216/52 |
| 6,010,283 | A | * | 1/2000 | Henrich et al. ............. 407/119 |
| 2002/0190435 | A1 | * | 12/2002 | O'Brien et al. ............. 264/400 |

FOREIGN PATENT DOCUMENTS

| | | |
|---|---|---|
| JP | 2003-211400 | 7/2003 |
| JP | 2003-253424 | 9/2003 |
| WO | 2004/035255 | 4/2004 |

OTHER PUBLICATIONS

N. Yasumaru, K. Miyazaki and J. Kiuchi, "Femtosecond-laser-induced Nanostructure Formed on Hard Thin Films of TiN and DLC", Appl. Phys. A 76, pp. 983-985, 2003.

P. E. Dyer and R. J. Farley, "Periodic Surface Structures in the Excimer Laser Ablative Etching of Polymers", Appl. Phys. Lett., 57, 8 (1990), pp. 765-767.

H. Hiraoka and M. Sendova, "Laser-induced Sub-half-micrometer Periodic Structure on Polymer Surfaces", App. Phys. Lett., 64, 5, (1994) pp. 563-565.

M. Bolle and S. Lazare, "Submicron Periodic Structures Provided on Polymer Surfaces with Polarized Excimer Laser Ultraviolet Radiation", Appl. Phys. Lett., 60 6 (1992), pp. 674-676.

A. E. Siegman, P. M. Fauchet, "Stimulated Wood's Anomalies on Laser-illuminated Surfaces", IEEE J. Quantum Electron, QE-20, 8 (1986), pp. 1384-1403.

Yukimasa Minami and Koichi Toyoda, "Incident-Angle Dependency of Laser-induced Surface Ripples on Metals and Semiconductors", Review of Laser Engineering, 28, 12, (2000), pp. 824-828.

Hiroshi Sawada, Kosuke Kawahara, Takafumi Ninomiya, Kou Kurosawa and Atsushi Yokotani, "Precise Periodic Structuring with Femtosecond-laser", Journal of the Japan Society for Precision Engineering, 69, 4 (2003), pp. 554-558.

Hiroshi Sawada, Kosuke Kawahara, Takafumi Ninomiya, Atsunobu Mori and Kou Kurosawa, "Effect of Precise Periodic Structures with Femtosecond-laser on Tribological Characteristics under Sliding Tests", Journal of the Japan Society for Precision Engineering, 70, 1 (2004), pp. 113-137.

Takeshi Furuno, Atsunobu Mori, Norio Tagawa, Hiroshi Sawada, "Effects of Precise Periodic Structures on Fatigue Resistance of Rolling-sliding contact surface", Proceedings of JAST Tribology Conference, Tokyo, May 2004, pp. 119-120.

International Search Report mailed Jan. 25, 2005 for International Application No. PCT/JP2004/013277.

* cited by examiner

FIG. 1

DLC FILM FORMATION CONDITION

|  | ION BOMBARDMENT | Si-DLC | DLC |
|---|---|---|---|
| REACTIVE GAS | Ar | TMS+CH$_4$ | CH$_4$ |
| GAS FLOW RATE | 30cc/min | 8cc+72cc/min | 89cc/min |
| TREATMENT TIME | 30min | 6min | 54min |
| FILM THICKNESS | - | 0.1μm | 0.9μm |
| SUBSTRATE TEMPERATURE | 199.5°C | | |

FIG. 2

PIN-ON DISK TEST CONDITION

| PIN MATERIAL | SUJ2 |
|---|---|
| CURVATURE RADIUS OF PIN END | 5mm |
| NUMBER OF PINS | 3 |
| SLIDING RADIUS | 16mm |
| SLIDING SPEED | 30.9mm/s |
| VERTICAL LOAD | 100~1000N |
| ATMOSPHERE | AIR |
| LUBRICATED | UNLUBRICATED |

FIG. 3

SCRATCH TEST CONDITION

| INITIAL LOAD | 0.03N |
|---|---|
| FINAL LOAD | 5N |
| LOAD SPEED | 5N/min |
| SCRATCH SPEED | 9.628mm/min |
| SCRATCH LENGTH | 10mm |
| INDENTER TYPE | ROCKWELL |
| INDENTER MATERIAL | DIAMOND |
| INDENTER END RADIUS | 200μm |

Si, E=0.4 μJ/pulse, V=0.25mm/s, f=100mm CONVEX LENS FOR USE

Si, E=0.45 μJ/pulse, V=0.25mm/s, f=100mm CONVEX LENS FOR USE

Si, E=0.25 μJ/pulse, V=0.25mm/s, f=100mm CONVEX LENS FOR USE

Si, E=100 μJ/pulse, V=0.25mm/s, f=100mm CYLINDRICAL LENS FOR USE

Si, E=400 μJ/pulse, V=0.25mm/s, f=100mm CYLINDRICAL LENS FOR USE

METHOD FOR ENHANCING ADHESION OF THIN FILM

BACKGROUND OF THE INVENTION

I. Technical Field

The present invention relates to a method of adhesively forming a solid thin film on the surface of a parent material.

II. Description of the Related Art

In recent years, functional thin films such as a solid lubricating film and a bioactive film have been under active research. Of the functional thin films, the solid lubricating film including a diamond-like carbon (DLC) film exhibits excellent tribology (friction, wear, and lubrication) characteristics and is thus brought to attention in various fields.

However, the adhesion of the solid lubricating film to the parent material is not sufficient, with the result that a critical problem such as peeling occurs in a high-surface-pressure use. Therefore, it is difficult to say that applications to a tool or a part whose contact surface pressure is high have been advanced well.

When the surface of an implant for a femur or a tooth is coated with a hydroxyapatite film, the bioactivity of osteoblasts on the surface of the implant is improved, so that a preferable bonding state with the bone is obtained. However, in some cases, peeling between the hydroxyapatite film and the main body of the implant becomes a large problem after an operation. Therefore, it is desirable to improve the adhesion of the coating film.

In order to solve the problems, research has been conducted for forming ripples on the surface of the parent material by grinding or sandblasting to improve the adhesion of the coating film. The ripples formed by grinding or sandblasting have random shapes because of the limitation of processing. A processing scale on the surface remains at the order of several μm to several tens of μm. In this case, the improvement of the adhesion of the coating film requires the formation of the ripples equal to or larger than the thickness of the coating film. Therefore, there is a report in which abrasive wear occurs or an effect cannot be obtained depending on a test method (Akio Motoi, Seiji Kataoka, and Kazuo Morikawa: Evaluation of adhesion of DLC film on mold for plastic forming, Bulletin of Tokyo Metropolitan Industrial Technology Research Institute, 6 (2003)).

In contrast, a patent application discloses that a nanostructure of approximately 1/10 of a wavelength order of a femtosecond laser beam can be formed using the femtosecond laser beam (JP 2003-211400 A). The nanostructure is formed in a long and thin fiber shape orthogonal to a polarization direction of the laser beam. For example, when a DLC film is irradiated with 300 shots at a fluence of 0.15 J/cm$^2$, a periodic structure in which an average interval is 100 nm and a length is 200 nm to 2000 nm is obtained. The periodic structure has a pitch which significantly depends on the fluence (N. Yasumaru, K. Miyazaki, and J. Kiuchi: Femtosecond-laser-induced nanostructure formed on hard thin films of TiN and DLC, Appl. Phys. A 76 (2003) 983). Therefore, when a laser beam of a normal Gaussian mode is emitted for scanning, there is a problem in that a periodic structure having protrusion portions and groove portions which are provided with high continuity at regular periodic pitches cannot be formed in a wide area because a periodic pitch is changed between a center portion and a peripheral portion. The pitch of the nanostructure also depends on the number of irradiation of the laser beam, so the periodic pitch changes in an overlapped portion and the continuity of the periodic structure is deteriorated. This phenomenon is specific to the femtosecond laser beam, so a nanosecond laser beam or a picosecond laser beam cannot be used. The nanostructure has a size equal to or smaller than a wavelength of light, so the nanostructure cannot be monitored using an optical microscope.

On the other hand, it has been known that a grating periodic structure is formed by interference of incident light and surface scattered light when a polymer is irradiated with a linearly polarized laser beam at a fluence close to a processing threshold, (see, for example, P. E. Dyer and R. J. Farley: Periodic surface structure in the excimer laser ablative etching polymers, Appl. Phys. Lett., 57, 8 (1990) P.765, H. Hiraoka and M. Sendova: Laser-induced sub-half-micrometer periodic structure on polymer surfaces, App. Phys. Lett., 64, 5 (1994) P.563, and M. Bolle and S. Lazare: Submicron periodic structures produced on polymer surfaces with polarized excimer laser ultraviolet radiation, Appl. Phys. Lett., 60, 6 (1992) P.674). It is reported that the same structure can be formed for a metal or a semiconductor and the periodic pitch thereof is changed according to an irradiation angle (see, for example, A. E. Siegman, P. M. Fauchet: Stimulated Wood's anomalies on laser-illuminated surfaces, IEEE J. Quantum Electron, QE-20, 8 (1986) P.1384 and Yukimasa Minami and Koichi Toyoda: Incident-angle dependency of laser-induced surface ripples on metals and semiconductors, Review of Laser Engineering, 28, 12 (2000) P.824).

In any case, the periodic structure of the wavelength order of the laser beam is formed. A formation area of the periodic structure is limited to a spot area of the laser beam, so an application range is limited to an extremely narrow range. However, the inventors of the present invention have recently found that the grating periodic structure of the wavelength order can be formed in a wide area when scanning using the linearly polarized laser beam at the fluence close to the processing threshold is performed with an overlap (Hiroshi Sawada, Kousuke Kawahara, Takafumi Ninomiya, Kou Kurosawa, and Atsushi Yokotani: Formation of precise periodic structures using femtosecond laser, Journal of the Japan Society for Precision Engineering, 69, 4 (2003) 554). When such a processing method is used, the grating periodic structure having the protrusion portions and the groove portions which are provided with high continuity at regular periodic pitches equal to the wavelength order can be extremely easily formed in principle. In addition, the orientation of the periodic structure can be arbitrarily set by only adjusting the polarization direction. When this method is used for a disk-shaped test piece which is rotatable, various periodic structure patterns such as a radial pattern, a concentric pattern, and a spiral pattern can be formed. The periodic structure has a rainbow appearance because of a light diffraction phenomenon, so the presence or absence of the periodic structure can be easily visually checked.

The grating periodic structure has the protrusion portions and the groove portions which are uniformly provided with high continuity. Therefore, an effect for dramatically reducing friction and wear which are caused by the generation of a fluid pressure, a function for preventing the jamming of wear powders caused by the discharge of the wear powders through the groove portions, an effect for reducing adhesion, an effect for increasing a fatigue strength, and the like are recognized in sliding tests carried out by the inventors of the present invention in this application (Hiroshi Sawada, Kousuke Kawahara, Takafumi Ninomiya, Atsunobu Mori, and Kou Kurosawa Effect of precise periodic structures with femtosecond-laser on tribological characteristics under sliding tests, Journal of the Japan Society for Precision Engineering, 70, 1 (2004) 113 and Takeshi Furuno, Atsunobu Mori, Norio Tagawa, Hiroshi Sawada: Effect of precise periodic structures on fatigue resistance of rolling-sliding contact surface, Proceedings of JAST Tribology Conference, Tokyo, 2004-5, (2004) 119).

It is determined that the grating periodic structure has surface functions such as cell sensitivity and a wettability control function.

The grating periodic structure can be formed using a nanosecond laser beam or a picosecond laser beam. When a femtosecond laser beam whose pulse width is short is used, a thermal influence is small, so that processing can be performed with fewer disturbances. Therefore, it is suitable to use the femtosecond laser beam.

Non-Patent Document 1

Akio Motoi, Seiji Kataoka, and Kazuo Morikawa: Evaluation of adhesion of DLC film on mold for plastic forming, Bulletin of Tokyo Metropolitan Industrial Technology Research Institute, 6 (2003).

SUMMARY OF THE INVENTION

The functional thin films exhibit excellent characteristics. However, there is a problem in that the adhesion is weak. Therefore, it is difficult to say that the practical applications of the functional thin films are advanced well. When the adhesion of the functional thin films can be improved, the range of use thereof can be significantly widened. The inventors of the present invention had an idea that the adhesion of the thin film could be uniformly improved by coating, with a thin film, a parent material in which a grating periodic structure having a regular periodic pitch is formed in a wide area, and then conducted the following experiments. As a result, the improvement of the adhesion of the thin film is recognized. In addition, it is recognized that the shape of the grating periodic structure is left in the surface of the thin film.

Thus, an object of the present invention is to provide a method for enhancing adhesion of a thin film of forming a grating structure by irradiating a surface of a parent material with a laser beam based on the above-mentioned findings, to use the grating structure. Another object of the present invention is to provide a method of improving adhesion of a thin film added with a surface function caused by a shape by leaving the grating structure in a surface of the thin film after coating.

A summary of the experiments conducted is as follows.
(Experimental Method)
(Laser Beam)

In the experiments, a titanium sapphire laser beam (pulse width is 120 fs, pulse energy is 140 µJ/pulse, and repetition frequency is 1 kHz) is focused by a cylindrical lens (f=100 mm) on a SUS304 substrate which is mirror-surface-finished (Ra: 0.02). A scanning speed of the laser beam is set to 0.5 mm/s.

(Formation of DLC Coating Film)

The SUS304 substrate having a mirror surface (Ra: 0.02) or a periodic structure (pitch is approximately 700 nm and amplitude is 200 nm to 250 nm) is subjected to ultrasonic cleaning with acetone for 20 minutes and then coated with a DLC coating film by a CVD method. A film thickness of the DLC coating film including an intermediate layer (Si-DLC) of 0.1 µm is set to 1 µm. A film formation condition is shown in FIG. 1.

(Pin-on-Disk Test)

A vertical load in a pin-on-disk friction testing machine is increased stepwise every 5 minutes to relatively evaluate adhesion based on the vertical load in which a frictional force rapidly increases. A test piece having a mirror surface, a test piece having a radial periodic structure, and a test piece having a concentric periodic structure are used. A pin-on-disk test condition is shown in FIG. 2.

(Scratch Test)

A Rockwell diamond indenter is pressed to the DLC film. Then, scratch is performed while the vertical load is increased. After the test, an observation is performed using a microscope to relatively evaluate the adhesion. A test piece having a mirror surface, a test piece having a periodic structure parallel with a scratch direction, and a test piece having a periodic structure perpendicular to the scratch direction are used. A scratch test condition is shown in FIG. 3.

(Experimental Result)

Pin-on-Disk Test

FIG. 4A shows a change in frictional force in the test piece having the mirror surface. FIG. 4B shows a change in frictional force in the test piece having the concentric periodic structure. FIG. 4C shows a change in frictional force in the test piece having the radial periodic structure.

As shown in FIG. 4A, in the case of the substrate having the mirror surface, a friction coefficient is approximately 0.1 in a range of up to 200 N. The friction coefficient rapidly increases immediately after a load of 400 N is applied, so the testis stopped at this time. On the other hand, as shown in FIGS. 4B and 4C, in the case of each of the substrate having the concentric periodic structure and the substrate having the radial periodic structure, the friction coefficient is equal to or smaller than 0.1 in a range of up to 1000 N. No abrasive wear is observed because the ripples are as small as 200 mm to 250 mm.

FIGS. 5A and 5B show the substrates obtained after the pin-on-disk test. In the case of the substrate having the mirror surface (FIG. 5B), the peeling of the DLC coating film occurs. A wear surface area caused by the pin widely expands unlike the case where the periodic structure is formed. In the case of the substrate having the concentric periodic structure (FIG. 5A), no significant damage is observed and a rainbow region which may be an interference area caused by transparent transfer materials is present in the pin (the same in the case of the radial periodic structure). After the friction test, a depth of a sliding trace in the substrate having the periodic structure reaches approximately 4 µm. The periodic structure is left.

Scratch Test

FIGS. 6A to 6C show scratch traces in the substrate having the mirror surface. FIGS. 6D to 6F show scratch traces in the substrate having the periodic structure formed in parallel with the scratch direction. In the case of the substrate having the mirror surface, the peeling already occurs at the vertical load of 0.5 N. On the other hand, in the case of the substrate having the periodic structure, the peeling hardly occurs even at 2 N (FIG. 6F). A depth of a scratch trace at 5 N reaches approximately 2.3 µm. The periodic structure is left.

Conclusion

It becomes clear that the adhesion strength of the DLC coating film is increased by the formation of the periodic structure. This may be caused by an increase in adhesive area (approximately 30%) and an anchor effect of the groove portions.

As shown in FIG. 7, the shape of the periodic structure is left in the surface of the DLC coating film which coats the periodic structure and a size thereof is sufficiently smaller than not only a size of the pin but also a size of the indenter. Therefore, it is expected that, when the pin or the indenter is in contact with the surface of the DLC coating film, a large number of periodic structure portions are deformed to reduce the stress, thereby suppressing the generation of cracks.

A method for enhancing adhesion of a thin film according to a first aspect of the present invention includes:

irradiating a surface of a parent material with a laser beam at a fluence close to a processing threshold;

scanning the surface of the parent material with an overlap on irradiated portions to form a grating structure spontaneously; and forming a solid thin film on the grating structure.

The laser beam which can be used here is one of various laser beams such as picosecond and nanosecond pulse laser beams including a $CO_2$ laser beam and a YAG laser beam. For example, a femtosecond laser beam can be also used.

Unlike the case where the surface of the parent material is irradiated with any of the picosecond and nanosecond pulse laser beams including the $CO_2$ laser beam and the YAG laser beam, when the surface of the parent material is irradiated with the femtosecond laser beam, a pulse width of the laser beam is small, so thermal conductivity is small. Therefore, a substrate temperature in the vicinity of a laser beam irradiation portion hardly increases, so that the deterioration of parent material characteristics which is caused by thermal influence can be prevented. A minute grating structure can be produced in only the laser beam irradiation portion, with the result that it is suitable for use in minute parts including a micromachine.

That is, when thermal diffusivity of the parent material is expressed by D and the pulse width of the laser beam is expressed by $\tau_l$, a thermal diffusion length $L_D$ at the time of laser beam irradiation can be expressed by "$L_D=(D\tau_l)^{1/2}$". Here, $D=k_{\xi}/\rho c_p$, where $k_{\xi}$, $\rho$, and $c_p$ denote, thermal conductivity, a density, and a specific heat, respectively. The thermal diffusion length $L_D$ is proportional to the square root of the pulse width $\tau_l$. Therefore, when the surface of the parent material is irradiated with an ultra-short pulse laser beam, the thermal diffusion length at the time of laser beam irradiation is very small. When the pulse width becomes equal to or smaller than a length corresponding to the picosecond, the thermal diffusion is negligible, so that it is advantageous to process small parts.

When the surface of a substrate is irradiated with the laser beam, the laser beam is scattered by ripples of the surface of the substrate, so that surface scattering occurs. When the substrate is irradiated with a linearly polarized laser beam, interference occurs between the incident light beam and a scattered light beam traveling along the surface. In the case where the fluence of the incident laser beam is close to a processing threshold, an abrasion is caused on only an interference part between the incident light and the scattered light traveling along the surface. When the abrasion begins to increase surface roughness, an intensity of the surface scattered light increases at the time of next laser irradiation. When the abrasion further advances, interference occurs even in the case where positions are separated from each other by a wavelength λ. When the laser irradiation is repeated, grating structures are successively and periodically formed at wavelength intervals. Therefore, the grating structure can be formed by only uniaxial laser irradiation. At least one of parent material surface characteristics such as adhesion of dust and fine particles, friction and wear, the improvement of adhesion of a wettability thin film can be changed by the grating structure formed in the surface of the parent material.

For example, a grating structure formed in an X-direction or a grating structure formed in a Y-direction can be used as the above-mentioned grating direction according to the polarization direction of the laser beam. The ripples formed by the laser irradiation are grown up to a wavelength order by approximately several 10 shots. When laser beam irradiation is performed 300 shots or more, the ripples become indefinite because of thermal influence. Therefore, scanning is performed with an overlap such that the total number of shots emitted to the same position becomes 10 to 300. Thus, it is possible to widely expand the grating structure to be formed. When the solid thin film is formed on the obtained grating structure, the adhesion of the thin film is improved.

In a method for enhancing adhesion of a thin film according to a second aspect of the present invention, the grating structure is obtained by combining structures formed in a plurality of directions with each other.

The method for enhancing adhesion of a thin film is based on the fact that the direction of the grating structure can be changed by adjusting the polarization direction of the laser beam. For example, laser irradiation is performed at the fluence close to the processing threshold and scanning with a laser beam in a direction is performed with an overlap on irradiated areas to form a first grating structure in a direction. After that, a relative angle between the surface of the parent material and the polarization direction of the laser beam is adjusted and the laser irradiation is performed at the fluence close to the processing threshold. Scanning with a laser beam is performed with an overlap to form a second grating structure which is combined with the first grating structure. Therefore, it is possible to obtain a grating structure in which the first and second grating structures formed in the plurality of directions are combined with each other. Thus, for example, when the relative angle between the surface of the parent material and the polarization direction of the laser beam is changed by 90° between the time of preceding grating formation and the time of subsequent grating formation, a mesh-shaped grating structure can be formed. When the relative angle between the surface of the parent material and the polarization direction of the laser beam is changed by an arbitrary angle other than 90° between the time of preceding grating formation and the time of subsequent grating formation, an oblique-mesh-shaped grating structure can be formed. When the solid thin film is formed on the obtained grating structure, the adhesion of the thin film is improved.

In a method for enhancing adhesion of a thin film according to a third aspect of the present invention, the grating structure is obtained by arranging structures formed in a plurality of directions.

The method for enhancing adhesion of a thin film is based on the fact that the direction of the grating structure can be changed by adjusting the polarization direction of the laser beam. For example, laser irradiation is performed at the fluence close to the processing threshold and scanning with a laser beam in a direction is performed with an overlap on irradiated areas to successively or discretely form grating structures in a first direction. After that, the relative angle between the surface of the parent material and the polarization direction is adjusted and the laser irradiation is performed at the fluence close to the processing threshold in a position adjacent to or separated from the grating structure. Then, scanning with a laser beam is performed with an overlap on irradiated areas, so that a grating structure which is adjacent to or separated from the grating structure previously formed in the first direction can be formed in a second direction different from the first direction. Therefore, when the relative angle between the surface of the parent material and the polarization direction of the laser beam is changed by 90° between the time of preceding grating formation and the time of subsequent grating formation, the grating structure formed in the X-direction and the grating structure formed in the Y-direction can be arranged. When the relative angle between the surface of the parent material and the polarization direction of the laser beam is changed by an arbitrary angle other than 90° between the time of preceding grating formation and the time of subsequent grating formation, the grating structures can be arranged in different directions. When the solid thin film is formed on the obtained grating structure, the adhesion of the thin film is improved.

In a method for enhancing adhesion of a thin film according to a fourth aspect of the present invention:

the surface of the parent material is irradiated with laser beams having fluences close to processing thresholds of a plurality of pulses obtained by division in a condition in which the pulses are not overlapped in time with each other; and the surface of the parent material is scanned with an overlap on irradiated portions to form the grating structure spontaneously.

According to the method for enhancing adhesion of a thin film, a laser beam generated by a laser beam generating device is divided into two laser beams by a half mirror. One of the lasers is optically delayed. The both laser beams are polarized in predetermined directions by polarization devices and applied to a half mirror. The laser beams polarized in the predetermined directions are superimposed on each other by the half mirror and the surface of the parent material is irradiated therewith. Therefore, the surface of the parent material can be irradiated with the laser beams at fluences close to processing thresholds of a plurality of pulses with different polarization directions at predetermined time intervals. When scanning is performed with an overlap on irradiated areas, a grating structure in which grating structures formed in the plurality of directions are combined with each other can be obtained at a time. Thus, for example, the surface of the parent material is irradiated with the laser beams at the fluences close to the processing thresholds of the plurality of pulses whose polarization directions are different from each other by 90° at predetermined time intervals and the scanning is performed with an overlap on the irradiated areas. As a result, the mesh-shaped grating structure in which the grating structure formed in the X-direction and the grating structure formed in the Y-direction different from the X-direction by 90° are combined with each other can be obtained at a time. In addition, the surface of the parent material is irradiated with the laser beams at fluences close to processing thresholds of a plurality of pulses whose polarization directions are different from each other by an arbitrary angle other than 90° at the predetermined time intervals and scanning is performed with an overlap on irradiated areas. As a result, an oblique-mesh-shaped grating structure in which grating structures intersect with each other at the arbitrary angle other than 90° can be formed. The polarization directions can be made different from each other by 0°, that is, aligned with each other. When the solid thin film is formed on the obtained grating structure, the adhesion of the thin film is improved.

In a method for enhancing adhesion of a thin film according to a fifth aspect of the present invention:

the surface of the parent material is irradiated with the laser beam at the fluence close to the processing threshold; and a polarization direction of the laser beam is changed during scanning with an overlap on the irradiated portions, to form a grating structure spontaneously in which structures are arranged in a plurality of directions in the spontaneous manner.

The method for enhancing adhesion of a thin film is based on the fact that the direction of the grating structure can be changed by adjusting the polarization direction of the laser beam. For example, laser irradiation is performed at the fluence close to the processing threshold and scanning with a laser beam is performed with an overlap on irradiated areas to form a grating structure at a predetermined length. After that, while the laser irradiation is continuously performed, the polarization direction of the laser beam is adjusted and the laser irradiation is being performed at the fluence close to the processing threshold in a position adjacent to or separated from the grating structure. Then, scanning with a laser beam is performed with an overlap on irradiated areas, so that a grating structure which is adjacent to or separated from the grating structure previously formed at the predetermined length can be formed in a different direction. Therefore, when the preceding polarization direction and the subsequent polarization direction are made different from each other by 90°, the grating structure formed in the longitudinal direction and the grating structure formed in the lateral direction can be arranged. When the polarization direction is changed arbitrary times by an arbitrary angle other than 90° during laser beam scanning, an arbitrary number of grating structures can be arranged in an arbitrary direction. When the solid thin film is formed on the obtained grating structure, the adhesion of the thin film is improved.

In a method for enhancing adhesion of a thin film according to a sixth aspect of the present invention, the laser beam is condensed by a cylindrical lens to form the grating structure in a wide area.

According to the method for enhancing adhesion of a thin film, the laser beam is increased to a laser beam whose diameter is large by a beam expander. When the laser beam whose diameter is large is condensed by the cylindrical lens, a linear laser beam whose width is narrow and length is long is obtained. Therefore, when the surface of the parent material is irradiated with the linear laser beam and scanning is performed with an overlap on irradiated areas, the grating structure can be widely formed in the spontaneous manner. Thus, a grating structure having a large area can be formed in a short time. When the solid thin film is formed on the obtained grating structure, the adhesion of the thin film is improved.

In a method for enhancing adhesion of a thin film according to a seventh aspect of the present invention, the solid thin film contains diamond-like carbon (DLC).

According to the method for enhancing adhesion of a thin film, the adhesion of the diamond-like carbon (DLC) coating film is improved. Therefore, even in a condition which cannot be used up to now, excellent tribology (friction, wear, and lubrication) characteristics are obtained.

In a method for enhancing adhesion of a thin film according to an eighth aspect of the present invention, the solid thin film contains hydroxyapatite.

According to the method for enhancing adhesion of a thin film, the adhesion of a hydroxyapatite coating film is improved. Therefore, it is possible to reduce a problem due to the peeling of a coating film after an implant operation for an implant such as an artificial joint or an artificial tooth root.

In a method for enhancing adhesion of a thin film according to a ninth aspect of the present invention, a shape of the grating structure formed in the parent material is left in an upper surface of the solid thin film.

According to the method for enhancing adhesion of a thin film, because of the grating structure in the solid thin film, surface functions such as a function for reducing friction and wear which are caused by a shape, a function for suppressing adhesion of fine particles, and cell sensitivity can be exhibited in conjunction with a function of the solid thin film.

In a processing tool according to a tenth aspect of the present invention, the method for enhancing adhesion of a thin film according to the present invention is used to form a solid thin film.

In the processing tool subjected to the surface processing, it is possible to realize a long life thereof and make the use thereof at a high surface pressure in which peeling occurs in a conventional case, so that a processing speed can be increased. When a shape of the grating structure is left in an upper surface of the solid thin film, an effect for reducing friction and wear which are caused by the shape and an effect for reducing adhesion are obtained. Therefore, the processing precision of an object to be processed is improved by the smooth emission of processing scraps, the suppression of an increase in temperature, or the like. The amount of use of cutting oil can be reduced.

In a mechanical part according to an eleventh aspect of the present invention, the method for enhancing adhesion of a thin film according to the present invention is used to form a solid thin film.

In the mechanical parts subjected to the surface processing, it is possible to realize a long life thereof and make the use thereof at the high surface pressure in which peeling occurs in a conventional case, so that the performance of vehicle parts, pump parts, precision mechanical parts, or the like can be improved. When the shape of the grating structure is left in the upper surface of the solid thin film, an effect for dramatically reducing friction and wear due to the generation of a fluid pressure caused by the shape is added in the case of use in a fluid. Therefore, it is suitable for, for example, vehicle parts or pump parts which are used in a fluid including oil.

In a biomaterial according to a twelfth aspect of the present invention, the method for enhancing adhesion of a thin film according to the present invention is used to form a solid thin film.

The biomaterial subjected to the surface processing is resistant to peeling and has stable performance for a long period of time. It is said that submicron ripples improves biological affinity. When the shape of the grating structure is left in the upper surface of the solid thin film, biological affinity and cell sensitivity which are caused by the shape are improved, so that a treatment period can be shortened and treatment results can be improved.

BRIEF DESCRIPTION OF THE DRAWINGS

FIG. 1 shows a film formation condition of a DLC coating film.

FIG. 2 shows a pin-on-disk test condition.

FIG. 3 shows a scratch test condition.

DETAILED DESCRIPTION OF THE INVENTION

Figure 4A:
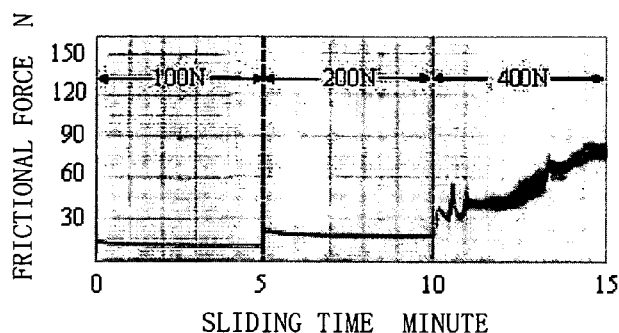
FIGS. 4A-C show changes in frictional force in test pieces having a mirror surface, a concentric periodic structure, and a radial periodic structure, each of which is used in a pin-on-disk test.
Figure 4B:
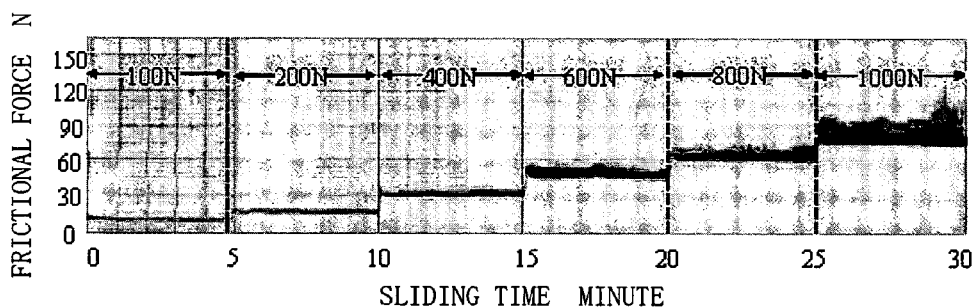
Figure 4C:
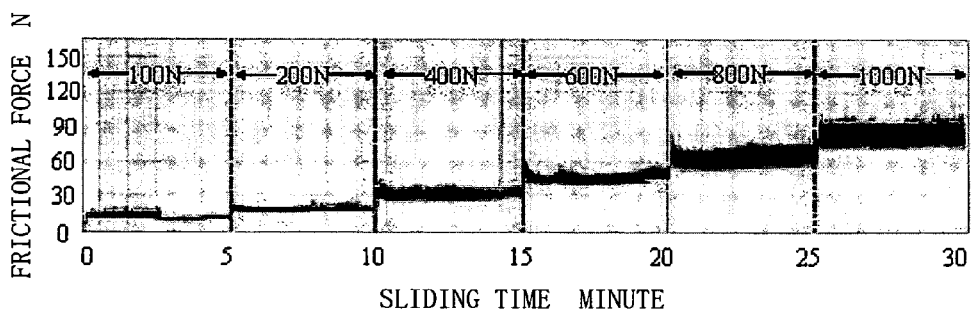
Figure 5A:
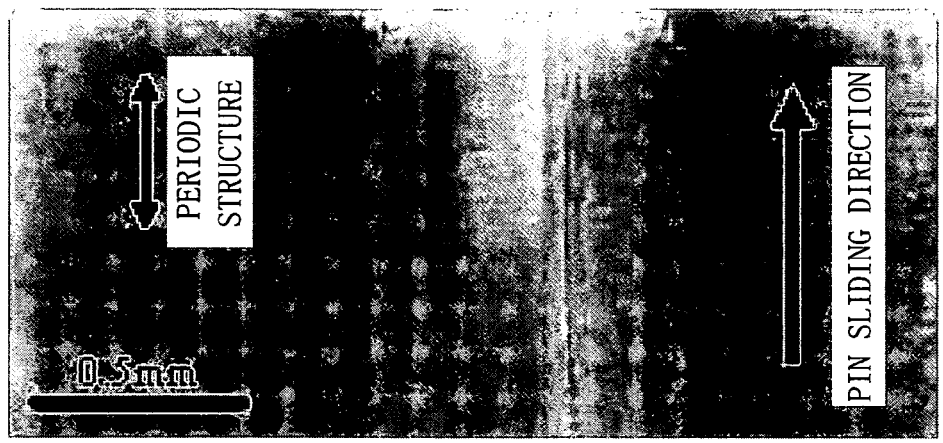
FIGS. 5A and 5B show substrates obtained after the pin-on-disk test, in which part A shows the substrate having the concentric periodic structure and part B shows the substrate having the mirror surface.
Figure 5B:
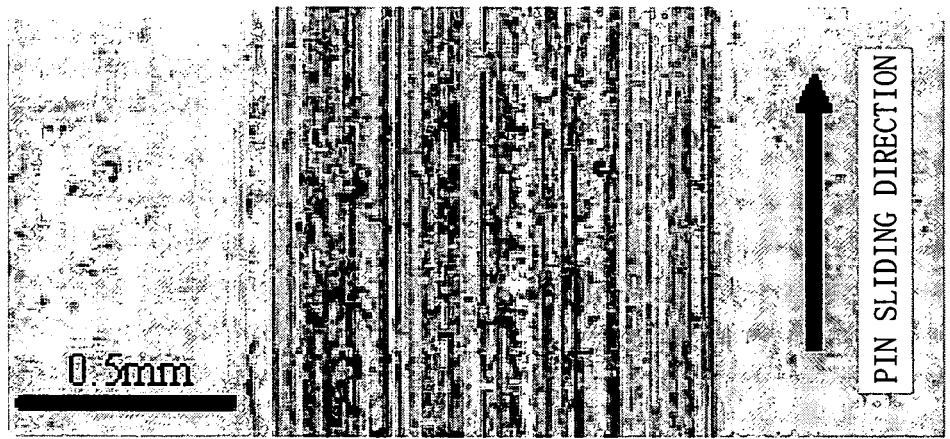
Figure 6A:
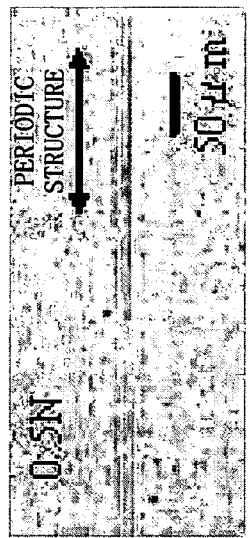
FIGS. 6A-F show scratch traces, in which parts A to C and part D to F show scratch traces in the substrate having the mirror surface and in a substrate having a periodic structure, respectively.
Figure 6B:
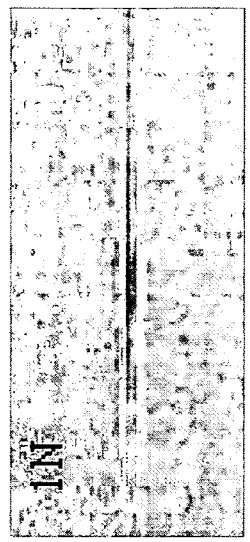
Figure 6C:
Figure 6D:
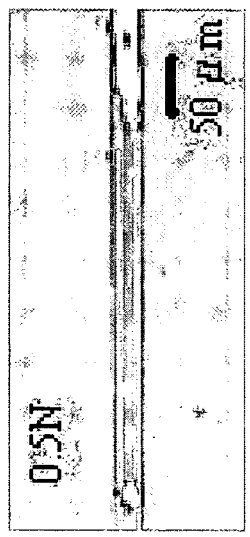
Figure 6E:
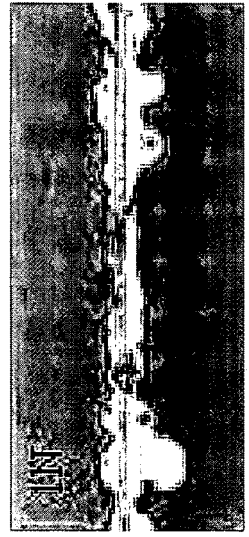
Figure 6F:
Figure 7:
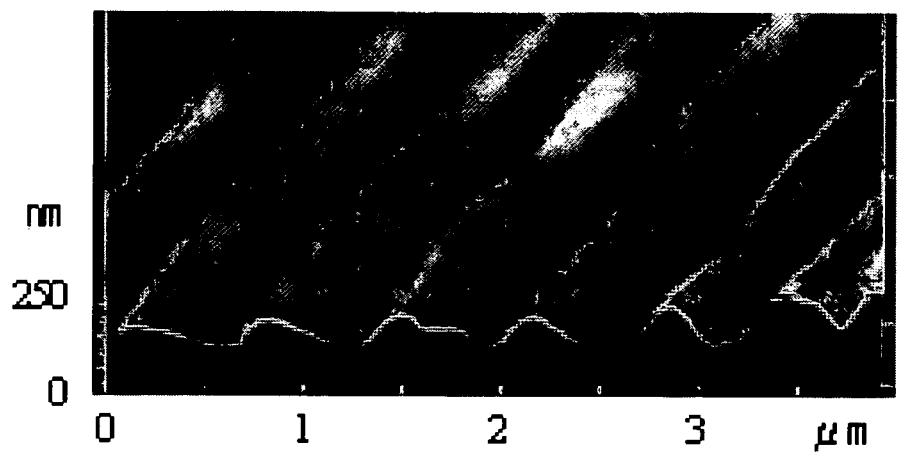
FIG. 7 shows a result obtained by measurement of a surface of a DLC coating film with which a periodic structure is coated using an atomic force microscope.
Figure 8A:
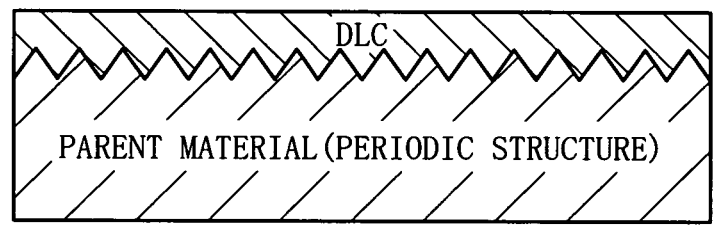
FIGS. 8A and 8B are schematic cross sectional views showing a parent material having a periodic structure and a parent material having the mirror surface.
Figure 8B:
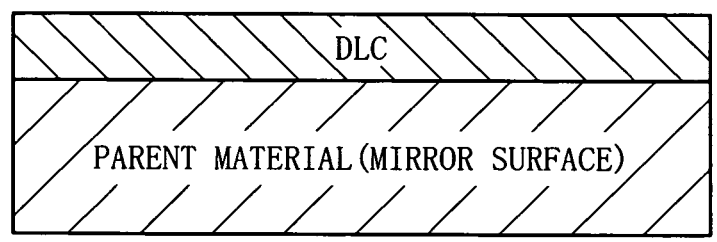

Hereinafter, the principle for forming a grating structure will be described with reference to the accompanying drawings and then an embodiment of the present invention will be described. FIG. 8A is a schematic cross sectional view showing a parent material having a grating structure on which a DLC coating film is formed by evaporation using a method according to the present invention. FIG. 8B is a schematic cross sectional view showing a parent material having a mirror surface on which a DLC coating film is formed by evaporation using the method. It is recognized that an anchor effect of the DLC coating film in the case shown in FIG. 8A is higher than that in the case shown in FIG. 8B.

Figure 9:
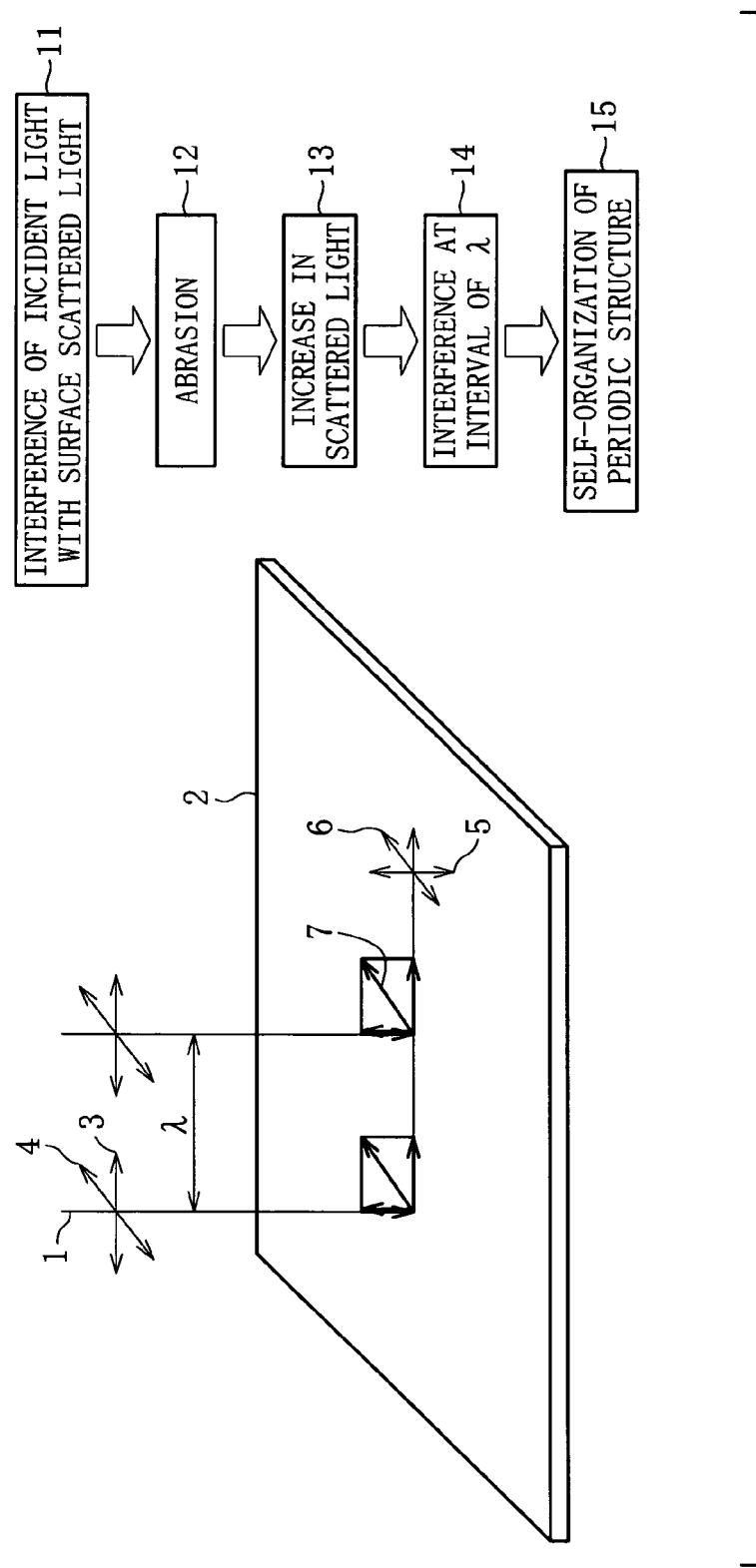
FIG. 9 is a schematic perspective diagram to explain a grating structure forming method which is the basis for the present invention.

FIG. 9 includes a schematic perspective view explaining a mechanism for forming the grating structure and a block diagram showing a process for forming the grating structure. In the schematic perspective view of FIG. 9, when a surface of a parent material 2 is irradiated with a laser beam 1, a p-polarized light component 3 of the incident light interferes with a p-polarized light component 5 of surface scattered light to generate a standing wave 7. Reference numeral 4 denotes an s-polarized light component of the incident light and 6 denotes an s-polarized light component of the surface scattered light.

When a fluence of the incident light is close to a laser processing threshold, an abrasion is caused on only an interference part between the p-polarized light component 3 of the incident light and the p-polarized light component 5 of the surface scattered light traveling along the surface (12). When the abrasion begins to increase surface roughness, an intensity of the surface scattered light increases at the time of next laser irradiation (13). When the abrasion further advances, interference occurs even in the case where positions are separated from each other by a wavelength $\lambda$. When the laser irradiation is repeated, the interference occurs at an interval of the wavelength $\lambda$ of the incident light (14). Therefore, the grating structure is formed (15).

Ripples of the grating structure are grown up to a wavelength order by 10 shots to 300 shots. When laser beam irradiation is performed for 300 shots or more, the ripples become indefinite. Therefore, laser beam scanning is performed with an overlap such that the number of shots emitted to the same position are 10 to 300. Thus, it is possible to widely expand the grating structure on the surface of a specimen. The laser beam scanning may be performed by the movement of a table supporting the parent material 2 or by scanning with a laser beam.

Figure 10:
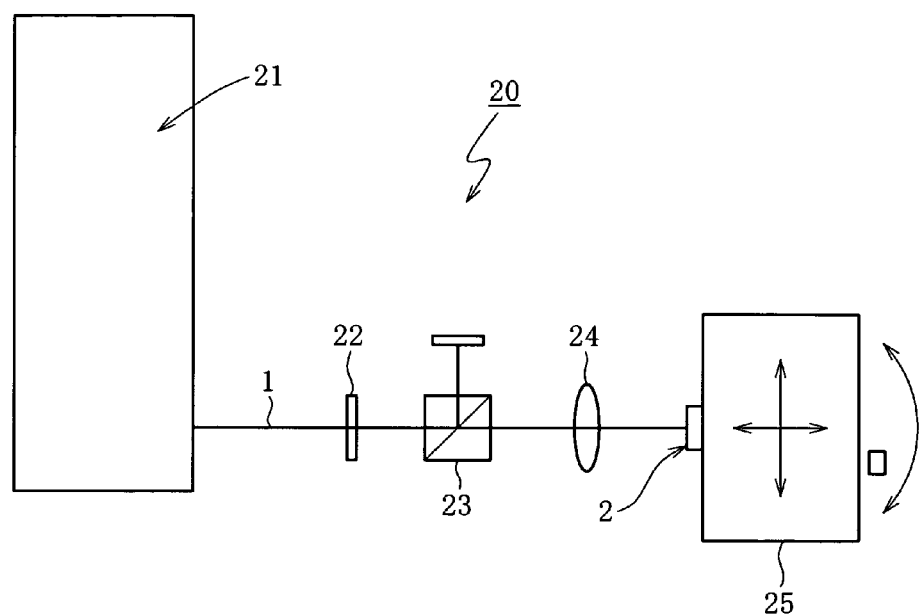
FIG. 10 is a schematic structural diagram of an apparatus used to produce the grating structure in an embodiment of the present invention.

FIG. 10 is a schematic diagram showing a grating structure forming apparatus 20. It should be noted that specific numeral values in the following description are merely examples and thus not particularly limited. A titanium sapphire laser beam 1 (pulse width: 120 fs, center wavelength $\lambda$: 800 nm, repetition frequency: 1 kHz, pulse energy E: 0.25 μJ to 400 μJ) is generated by a titanium sapphire laser beam generating apparatus 21. The pulse energy can be adjusted using a ½-wavelength plate 22 and a polarization beam splitter 23. The surface of the parent material 2 located on an X-Y-θ stage 25 is irradiated with the laser beam 1 through a lens (focal length f=100 mm) 24. A resolution of the X-Y-θ stage 25 may be arbitrarily determined, and the resolution is, for example, 2 μm. In order to irradiate the parent material 2 with the laser beam 1 with an overlap, the parent material 2 is moved at a speed of 0.25 mm/s (125 pps) by the X-Y-θ stage 25 to cause an abrasion due to interference between the incident light and scatted light traveling along the surface, with the result that the grating structure is formed.

A scanning speed of the parent material 2 is set based on a spot diameter of the laser beam 1 and the wavelength $\lambda$ of the laser beam 1. An incident angle θ of the laser beam 1 relative to the parent material 2 is set to 0°. An Si and a Cu tape, each of which has a thickness of 50 μm, are used for the parent material 2. The grating structure obtained by the above-mentioned operation is observed using a laser microscope and an atomic force microscope (AFM).

(Grating Structure of Si)

Figure 11B:
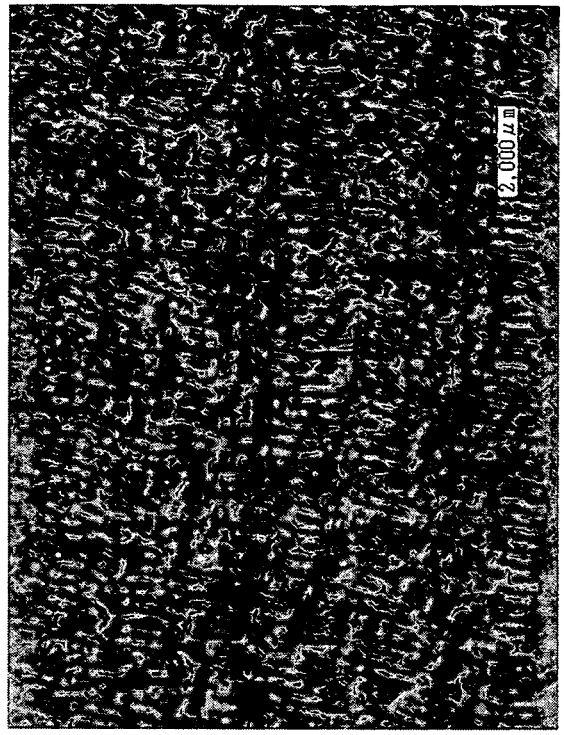
FIG. 11B is an enlarged detail view showing the grating structure shown in FIG. 11A.
Figure 11A:
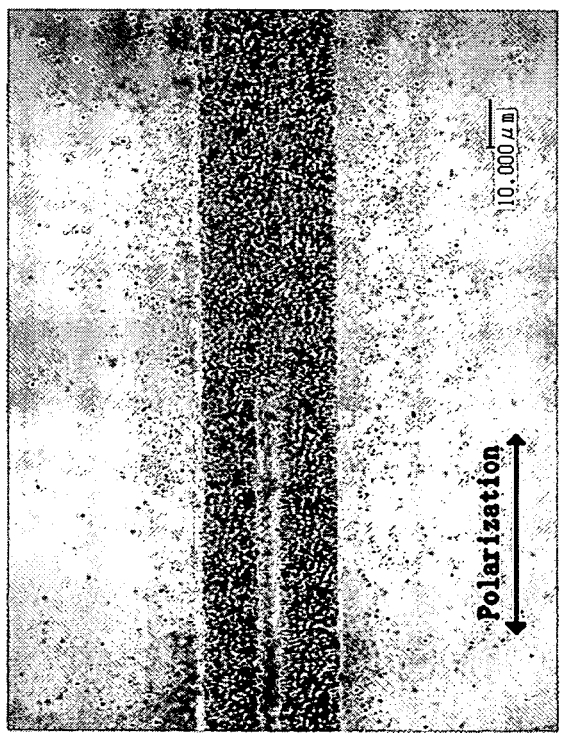
FIG. 11A is a plan view showing a grating structure formed by scanning an Si surface with a laser beam in a direction parallel with a polarization direction three times using the grating structure forming method according to the embodiment of the present invention.
Figure 12B:
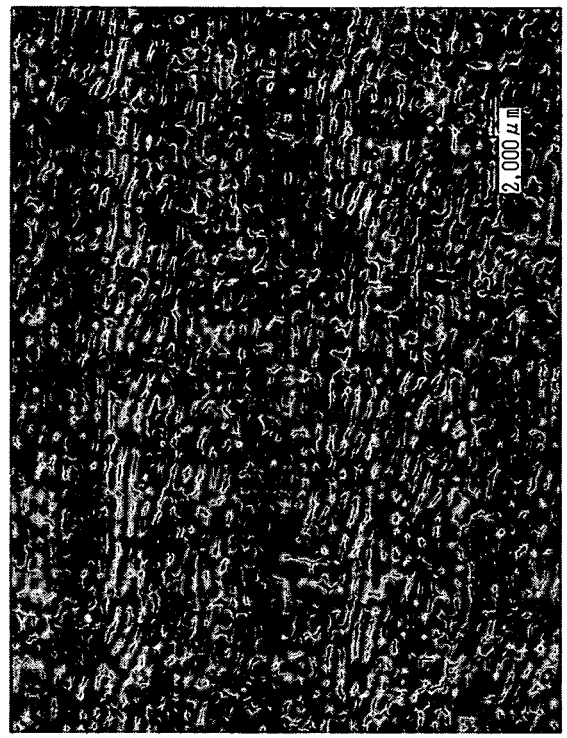
FIG. 12B is an enlarged detail view showing the grating structure shown in FIG. 11A.
Figure 12A:
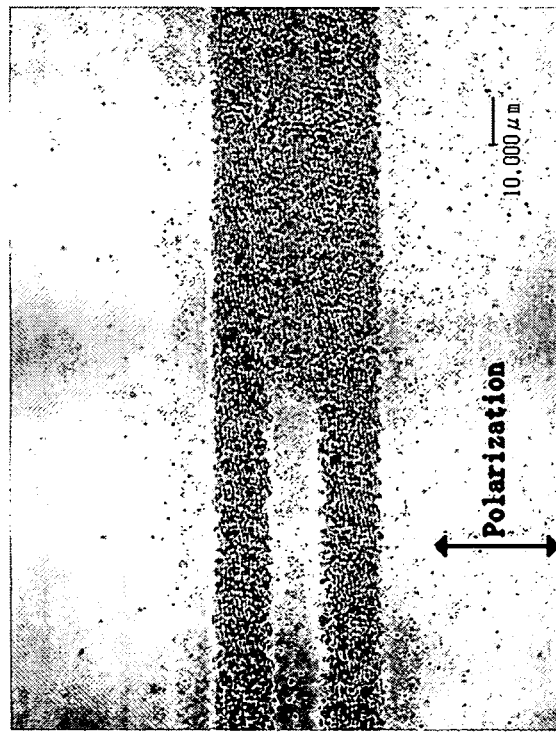
FIG. 12A is a plan view showing a grating structure formed by scanning the Si surface with the laser beam in a direction orthogonal to a polarization direction three times using the grating structure forming method according to the embodiment of the present invention.

A surface of an Si substrate serving as the parent material 2 is scanned three times with the laser beam 1 by a plane-convex lens 24 (f=100 mm) at a fluence close to a processing threshold, to form a grating structure. FIGS. 11A and 11B show a grating structure obtained in the case where the scanning direction of the laser beam 1 is in parallel with a polarization direction. FIGS. 12A and 12B show a grating structure obtained in the case where the polarization direction is rotated by 90°. Each of FIGS. 11A and 12A shows the entire state and each of FIGS. 11B and 12B shows an enlarged detail of the formed grating structure. In each of FIGS. 11A and 12A, in order to easily understand three-time scanning, laser irradiation is stopped during the second scanning. Each of the grating structures is formed orthogonal to the polarization direction. A periodic pitch of each of the grating structures is approximately 700 nm which is slightly shorter than the wavelength $\lambda$ (800 nm) of the laser beam. Large disturbance of an overlapping part in each scanning is not observed.

Figure 13:
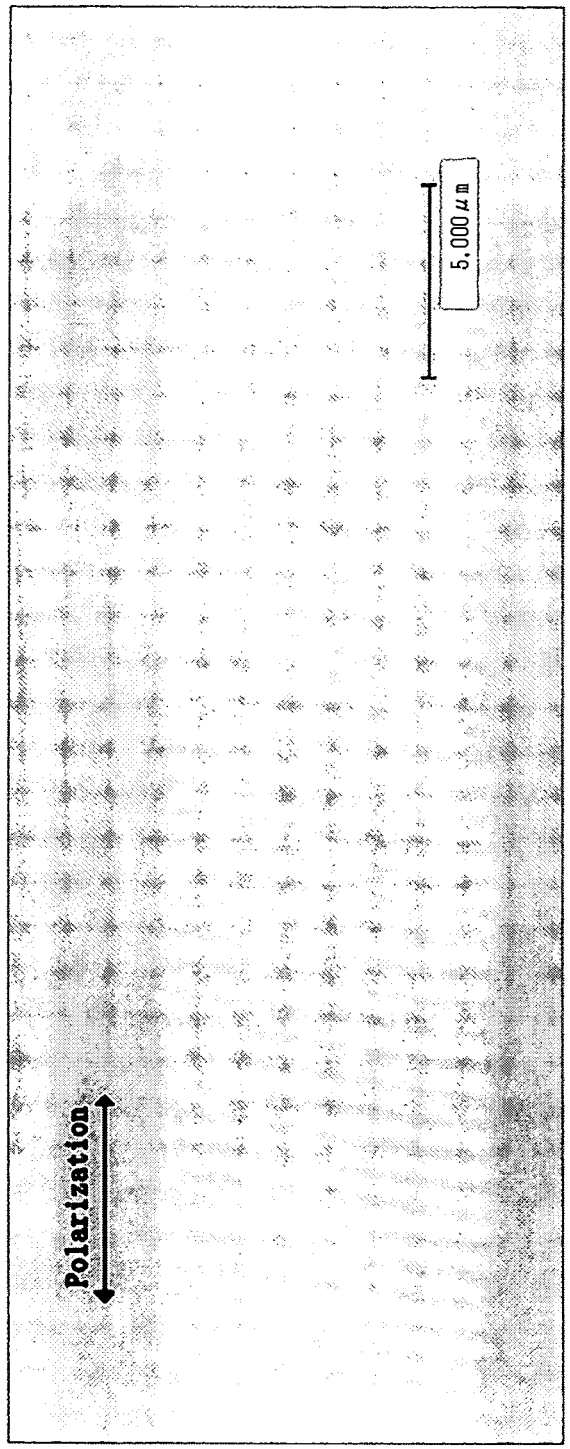
FIG. 13 is a plan view showing a grating structure formed in the Si surface at a laser fluence closest to a processing threshold using the grating structure forming method according to the embodiment of the present invention.

FIG. 13 shows a grating structure obtained in the case where a laser fluence is reduced to a value closest to the processing threshold to minimally suppress abrasion. A periodic pitch of the grating structure is 795 nm and thus substantially equal to the wavelength $\lambda$ (center wavelength is 800 nm) of the laser beam.

Figure 14:
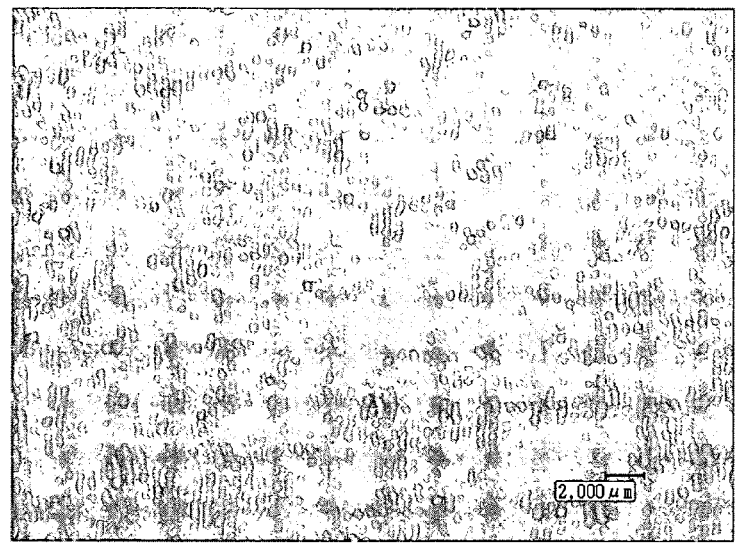
FIG. 14 is an enlarged detail view showing a grating structure formed in the Si surface by the grating structure forming method according to the embodiment of the present invention using a cylindrical lens.

In order to form the grating structure in a wider area, the laser beam is expanded by a beam expander. Then, a linear laser beam condensed by a cylindrical lens (f=100 mm) is emitted to form a grating structure. As a result, the grating structure is formed corresponding to one-time scanning at a width of 2 mm or more. FIG. 14 shows the formed grating structure. A periodic pitch is 700 nm. As a result, the obtained grating structure is not significantly different from the grating structure formed using the plane-convex lens at the fluence close to the processing threshold (FIGS. 11A and 11B).

When the grating structure obtained using the cylindrical lens is irradiated with white light, spectral performance is observed. In addition, it is recognized that the periodic grating structure having a regular interval is obtained in a wide area.

(Grating Structure of Cu Tape)

Figure 15:
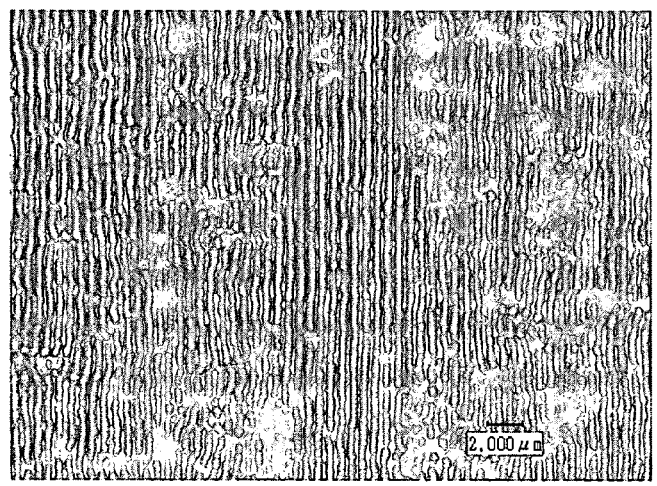
FIG. 15 is a plan view showing a grating structure formed in a Cu tape surface by the grating structure forming method according to the embodiment of the present invention using the cylindrical lens.

When a grating structure is to be formed in the Cu tape using the cylindrical lens (f=100 mm), the grating structure is formed corresponding to one-time scanning at a width of 2 mm or more as in the case of the Si substrate. FIG. 15 shows the grating structure in the CP tape. A periodic pitch of the grating structure is approximately 700 nm. As a result, a difference with the case of the Si substrate is hardly observed.

Even in the case of each parent material except the Si and Cu tape, the grating structure can be formed as in the cases of the Si and Cu tapes.

Figure 16A:
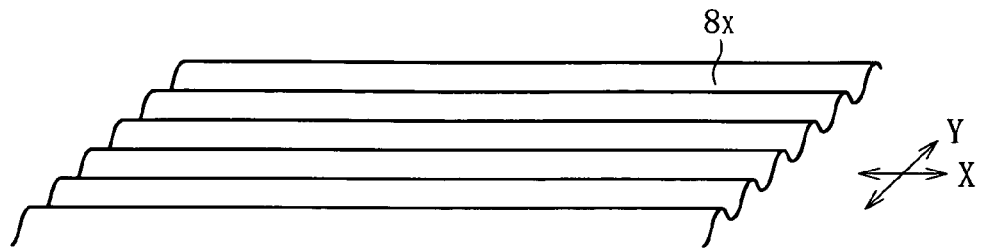
FIG. 16A is an enlarged perspective view showing a grating structure formed in an X-direction.
Figure 16B:
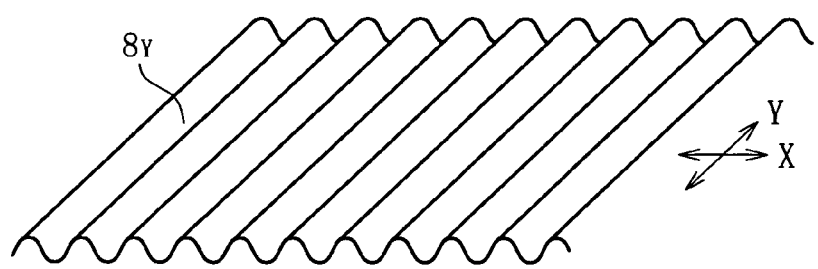
FIG. 16B is an enlarged perspective view showing a grating structure formed in a Y-direction.

Therefore, according to the present invention, the surface of the parent material is irradiated with the laser beam and scanning with the irradiation laser beam is performed to form the grating structure. When the polarization direction of the laser beam is set to a Y-direction, a grating structure $8_X$ can be formed in an X-direction as shown in FIG. 16A. When the polarization direction of the laser beam is set to the X-direction, a grating structure $8_Y$ can be formed in the Y-direction as shown in FIG. 16B.

Figure 16C:
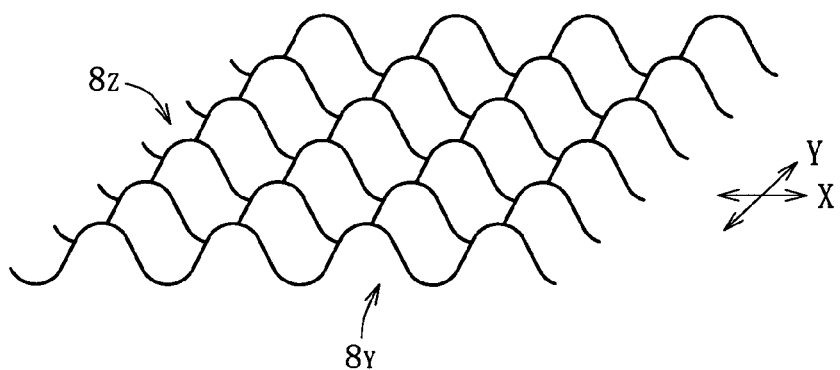
FIG. 16C is a perspective view showing a complex grating structure in which the grating structure formed in the X-direction and the grating structure formed in the Y-direction are combined with each other.

The following operation is performed based on the fact that the direction of the grating structure can be changed by adjusting the polarization direction of the laser beam. For example, laser irradiation is performed at the fluence close to the processing threshold and scanning with a laser beam in a direction is performed with an overlap on irradiated areas to form the grating structure $8_X$ in a direction as shown in FIG. 16A. After that, a relative angle between the surface of the parent material and the polarization direction is adjusted and the laser irradiation is performed so as to be superimposed on the grating structure $8_X$ at the fluence close to the processing threshold. Scanning with a laser beam is performed with an overlap on irradiated areas to form the grating structure $8_Y$ in a different direction which is combined with the grating structure $8_X$. Therefore, it is possible to obtain a grating structure $8_Z$ in which the grating structures formed in the plurality of directions are combined with each other. Thus, for example, as shown in FIG. 16C, when the relative angle between the surface of the parent material and the polarization direction of the laser beam is changed by 90° between the time of preceding grating formation and the time of subsequent grating formation, a mesh-shaped grating structure can be formed.

When the relative angle between the surface of the parent material and the polarization direction of the laser beam is changed by an arbitrary angle other than 90° between the time of preceding grating formation and the time of subsequent grating formation, an oblique-mesh-shaped grating structure can be formed.

Figure 16D:
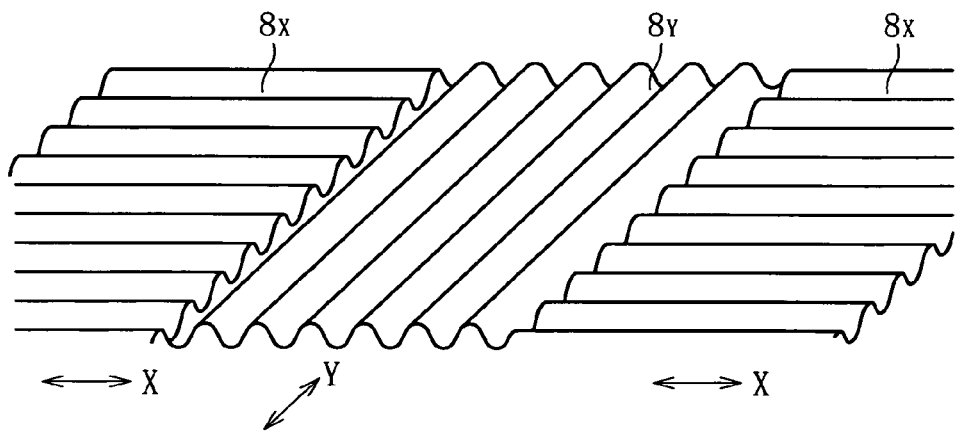
FIG. 16D is a perspective view showing a grating structure in which the grating structure formed in the X-direction and the grating structure formed in the Y-direction are arranged.

For example, laser irradiation is performed at the fluence close to the processing threshold and scanning with a laser beam in a direction is performed with an overlap on irradiated areas to form the grating structure $8_X$ in a first direction. After that, the relative angle between the surface of the parent material and the polarization direction is adjusted and the laser irradiation is performed at the fluence close to the processing threshold in a position adjacent to or separated from the grating structure $8_X$. Then, scanning with a laser beam is performed with an overlap on irradiated areas, so that the grating structure $8_Y$ which is adjacent to or separated from the grating structure $8_X$ previously formed in the first direction can be formed in a second direction different from the first direction, as shown in FIG. 16D. Therefore, when the relative angle between the surface of the parent material and the polarization direction of the laser beam is changed by 90° between the time of preceding grating formation and the time of subsequent grating formation, the grating structure $8_X$ formed in the X-direction and the grating structure $8_Y$ formed in the Y-direction can be arranged. When the relative angle between the surface of the parent material and the polarization direction of the laser beam is changed by an arbitrary angle other than 90° between the time of preceding grating formation and the time of subsequent grating formation, the grating structures can be arranged in different directions.

Figure 17:
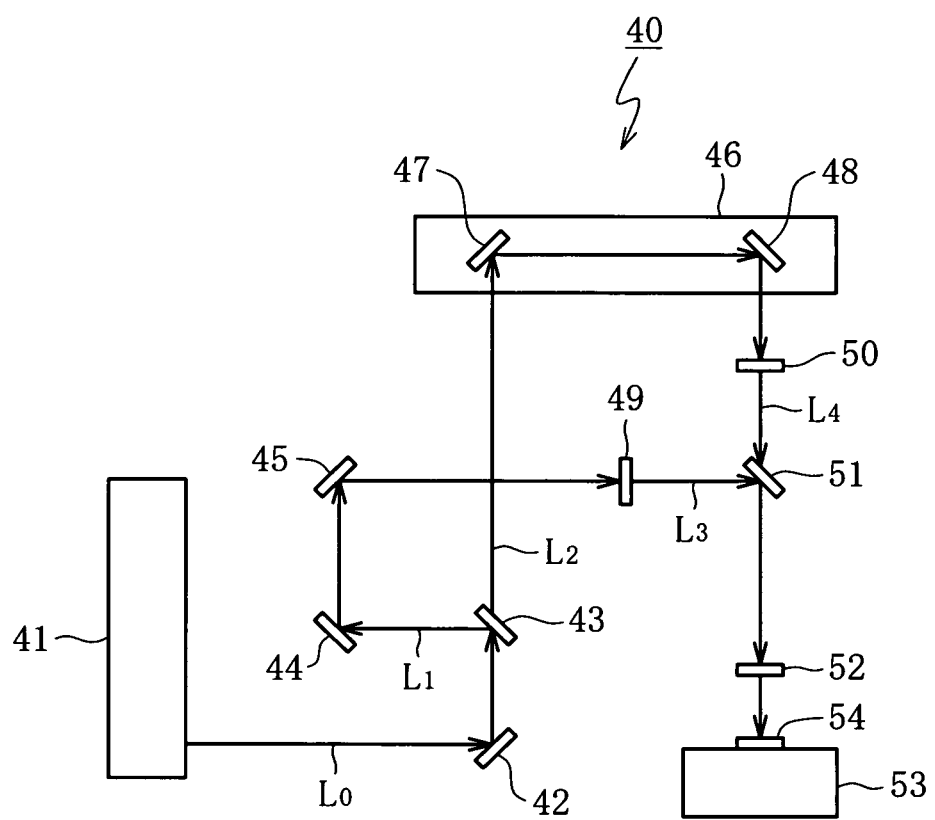
FIG. 17 is a structural diagram showing a grating structure forming apparatus for dividing a pulse laser beam into a plurality of pulse laser beams each having a predetermined time interval to form a grating structure having a direction and a grating structure having another direction during the same process.

The following operation is performed based on the above-mentioned fact that the direction of the grating structure can be changed by adjusting the polarization direction of the laser beam. The grating structure in which the grating structures formed in the plurality of directions are combined with each other as shown in FIG. 16C can be obtained using a laser irradiation apparatus 40 shown in FIG. 17 by a single process. In the grating structure forming apparatus 40 shown in FIG. 17, a laser beam $L_0$ generated by a titanium sapphire laser beam generating device 41 is totally reflected by a mirror 42 and divided into laser beams $L_1$ and $L_2$ by a half mirror 43. The laser beam $L_1$ is totally reflected by each of mirrors 44 and 45. In contrast, the laser $L_2$ is optically delayed by an optical delay portion 46. The optical delay portion 46 includes mirrors 47 and 48. Laser beams $L_3$ and $L_4$ obtained by polarizing the laser beams $L_1$ and $L_2$ in predetermined directions by polarization devices 49 and 50, respectively, are applied to a half mirror 51. The polarized laser beams $L_3$ and $L_4$ are superimposed on each other by the half mirror 51 and a surface of a parent material 54 mounted on an X-Y table 53 is irradiated therewith through a lens 52. Therefore, the surface of the parent material 54 can be irradiated with the laser beams $L_3$ and $L_4$ at fluences close to processing thresholds of a plurality of pulses with different polarization directions at predetermined time intervals. When scanning is performed with an overlap on irradiated areas, the grating structure $8_Z$ in which the grating structures formed in the plurality of directions are combined with each other as shown in FIG. 16C can be obtained at a time.

For example, the surface of the parent material is irradiated with the laser beams $L_3$ and $L_4$ at the fluences close to the processing thresholds of the plurality of pulses whose polarization directions are different from each other by 90° at predetermined time intervals and the scanning is performed with an overlap on the irradiated areas. As a result, the mesh-shaped grating structure $8_Z$ in which the grating structure $8_X$ formed in the X-direction and the grating structure $8_Y$ formed in the Y-direction different from the X-direction by 90° are combined with each other as shown in FIG. 16C can be obtained by a single process. In addition, the surface of the parent material is irradiated with the laser beams at fluences close to processing thresholds of a plurality of pulses whose polarization directions are different from each other by an arbitrary angle other than 90° at the predetermined time intervals and scanning is performed with an overlap on irradiated areas. As a result, an oblique-mesh-shaped grating structure in which grating structures intersect with each other at the arbitrary angle other than 90° can be formed. In a matter of course, the angle can be 0°, that is, two polarization directions are aligned with each other.

Next, a change in surface characteristic of the parent material which is caused by the above-mentioned grating structure will be described. The SUS304 substrate is used as the parent material whose surface characteristic is changed. A titanium sapphire laser beam of ultra-short pulse (for example, pulse width is 120 fs, center frequency is 800 nm, repetition frequency is 1 kHz, and pulse energy is 140 µJ/pulse) is used as an irradiation laser beam. The laser beam is expanded by a beam expander. Then, the laser beam condensed by a cylindrical lens to irradiate the surface of the SUS304 substrate therewith. Scanning is performed at a scanning speed of 0.5 mm/s with an overlap on irradiated portions. As a result, a grating structure is formed at a periodic pitch of 0.7 µm and a depth of 0.2 µm. It is apparent from results obtained by a pin-on-disk test and a scratch test that, when the SUS 304 substrate (parent material) in which the grating structure is formed is coated with a DLC coating film, the adhesion to the parent material is significantly improved. In addition, it is observed that the shape of the grating structure is left in the surface of the DLC coating film.

According to the method for enhancing adhesion of a thin film in the present invention, the grating structure is formed in the surface of the parent material in the spontaneous manner and the solid thin film is formed on the grating structure. Therefore, the peeling of the solid thin film, the DLC coating film in particular, is prevented by, for example, a strong anchor effect caused by the grating structure. When the shape of the grating structure formed in the parent material is left in the upper surface of the solid thin film, surface functions such as a function for reducing friction and wear which are caused by a shape, a function for suppressing adhesion of fine particles, and cell sensitivity can be exhibited in conjunction with a function of the solid thin film.

The method according to the present invention is useful to improve the adhesion strength of the solid thin film in all fields. In particular, it is useful to improve the tribology characteristics.

The invention claimed is:

1. A method for enhancing adhesion of a thin film, said method comprising:
   irradiating a surface of a parent material with a laser beam polarized in one predetermined direction at a fluence (energy density) close to a processing threshold;
   performing a scan with the laser beam on the surface of the parent material with an overlap such that the total number of shots of the laser beam irradiated on the same position of the surface of the parent material is within a range of 10 to 300, so as to cause ablation on the surface of the parent material at a region where interference occurs between a polarization light component of a surface scattered light traveling along the surface of the parent material, and thereby to form a grating structure spontaneously on the surface of the parent material in one predetermined direction orthogonal to a polarization direction of the incident light of the laser beam; and forming a solid thin film on the grating structure of the surface of the parent material.

2. The method for enhancing adhesion of a thin film according to claim 1, further comprising condensing the laser beam by a cylindrical lens to form the grating structure in a wide area.

3. The method for enhancing adhesion of a thin film according to claim 1, wherein the solid thin film contains diamond-like carbon (DLC).

4. The method for enhancing adhesion of a thin film according to claim 1, wherein the solid thin film contains hydroxyapatite.

5. The method for enhancing adhesion of a thin film according to claim 1, wherein a shape of the grating structure formed on the surface of the parent material is left in an upper surface of the solid thin film to add a surface function caused by the shape to the solid thin film.

\* \* \* \* \*